United States Patent
Lindgren et al.

(10) Patent No.: US 6,577,675 B2
(45) Date of Patent: Jun. 10, 2003

(54) SIGNAL SEPARATION

(75) Inventors: Ulf Lindgren, Lund (SE); Holger Broman, Kungsbacka (SE)

(73) Assignee: Telefonaktiegolaget LM Ericsson, Stockholm (SE)

( * ) Notice: Subject to any disclaimer, the term of this patent is extended or adjusted under 35 U.S.C. 154(b) by 0 days.

(21) Appl. No.: 09/901,471

(22) Filed: Jul. 9, 2001

(65) Prior Publication Data

US 2002/0101942 A1 Aug. 1, 2002

Related U.S. Application Data

(63) Continuation of application No. 08/960,685, filed on Oct. 30, 1997, now abandoned.

(30) Foreign Application Priority Data

May 3, 1995 (SE) ............................................. 9501657-2

(51) Int. Cl.[7] .................................................. H04L 27/30
(52) U.S. Cl. ....................... 375/148; 375/267; 375/285; 375/343; 375/347; 375/349; 455/278.1; 455/296
(58) Field of Search ................................. 375/142–144, 375/148, 150, 152, 267, 278, 284, 285, 296, 299, 343, 346, 347, 349, 350; 455/296, 278.1, 279.1; 370/320, 335, 342, 441, 479

(56) References Cited

U.S. PATENT DOCUMENTS

| | | | |
|---|---|---|---|
| 4,683,590 A | 7/1987 | Miyoshi et al. | |
| 5,208,786 A | 5/1993 | Weinstein et al. | |
| 5,539,832 A | 7/1996 | Weinstein et al. | |
| 5,574,824 A | 11/1996 | Slyh et al. | |
| 5,675,659 A | 10/1997 | Torkkola | |
| 5,909,646 A | 6/1999 | Deville | |
| 6,002,776 A | * 12/1999 | Bhadkamkar et al. | ......... 381/66 |
| 6,343,268 B1 | * 1/2002 | Balan et al. | ................ 704/228 |

FOREIGN PATENT DOCUMENTS

EP 0565479 10/1993

* cited by examiner

*Primary Examiner*—Stephen Chin
*Assistant Examiner*—Dac V. Ha
(74) *Attorney, Agent, or Firm*—Oppedahl & Larson LLP

(57) ABSTRACT

Method for separating a mixture of source signals to regain said source signals, said method being based on measured signals. The method being characterized in, that every measured signal is brought to a separation structure comprising cross connected linear filters and subsequent adders, that cross correlation functions between the signals after said adders are calculated for delays k between a first delay K1 and a last delay K2, that a criterion function is used to determine how the linear filters comprised in said separation structure will be designed in every real situation, that said criterion function is formulated as a sum of terms where the addition is extended to all possible cross correlation functions between the output signals of separation structure at all possible delays (k) between K1 and K2, and that each term in said sum has a weight factor and another factor consisting of an even function, f, of a specific cross correlation function at a specific delay.

20 Claims, 4 Drawing Sheets

SIGNAL SEPARATION

This is a Continuation of application Ser. No. 08/960,685 filed Oct. 30, 1997, now abandoned.

TECHNICAL FIELD

The present invention relates to a new method of separating N source signals from N linear combinations of said signals using a criterion based on second order statistics. The basic idea is that every input signal (measurable signal) consists of a number of source signals. The purpose of the invention is to separate the source signals from the measurable signals using a criterion.

BACKGROUND OF THE INVENTION

In many situations, measuring and sampling of signals are performed for specific purposes as in the fields of cellular phones, data communication, medical measuring equipment, etc. At such a measuring, there are one or more primary signals and several secondary signals. The primary signals are the signals of interest for the receiver of the measurement and the secondary ones are not desired.

In a situation where a telephone is used in a car, the primary source signal can be the speaker and the secondary source signal background noise. The receiver of such a phone conversation experiences the secondary source signal as a disturbance. Therefore it is desired to reduce the secondary signal. This can be achieved by measuring the signal in the car using at least two microphones.

GSM cellular phones use a so called speech coder with which you code the voice so that a narrow bandwith digital transmission can be used for transferring the communication. In order to achieve a coding, it is required that the signals is a speaking voice, i.e. not singing, music, etc. If the primary signal is disturbed by other secondary signals such as noise, music and so on, the result of the speech coding can be very poor, even not understandable. Therefore, there is much to gain by using the suggested invention in a preprocess to the speech coding so that effects of secondary signals are reduced.

Another problem in the telecommunications area is occuring echos. Echos can appear when a four wire connection is to be converted into a two wire connection. The converting can be realized with a so called hybride. For a specific connection the echo can be insignificant, but since the communication can be connected in a variety of different ways echos can appear. The problem is solved by an echo cancellor. The present invention has the potential of achieving better performance than a conventional echo cancellor and this is without surveillance strategies.

The importance of antenna array techniques are steadily increasing and with it the problem of separating conversations increases. Normally, an antenna array consists of a number of antennas arranged in a row. These antennas can, with the help of software, be controlled so that antenna lobe is arranged in the desired direction. If two mobile units are in the same area, it can be motivated to regard the potential of the invention in order to increase the quality of the signals of the mobile units separately.

When data is transferred via an electric cable, superposition of different data sequences may occur. The effects of this can be reduced by using the present invention.

A hearing impaired person normally has problems to separate the primary signal from the secondary one with the use of a conventional hearing aid. As an example, the armature of a fluorescent tube can be a secondary signal causing a great disturbance in the hearing aid. The present invention can reduce this disturbance. A similar problem occurs when the hearing impaired person is having a conversation in a group of people. This problem is also called the cocktail party problem. The present invention can reduce the effect of this problem.

Medical measuring equipment, such as electrocardiogram (E.C.G.), can also use the invention in order to give prominence to the signal of interest at the measuring.

In an article from 1991 [1] a technique to separate source signals mixtures without memory was presented. The technique is based on the assumption that the sources are statistically independent of each other. By evaluating all possible moments of the measured signals it is theoretically possible to separate the source signals from each other. However, it is practically impossible to evaluate all such moment since in the general case there is an infinite number of such moments. The method presented in [1] aims at via first and third moments accomplish a separation. By formulating the cross moments of the measures signals a non linear system of simultaneous equation appears, which can be solved by iteration. The solution to that system is not unique since the system is non-linear. This method as such is afflicted with problems since the cross moment equations are chosen by the user, i.e. in advance it is not possible to know whether the solution represents a minimum. If the desired solution does not represent a minimum, the iterative solution will not converge to it. In an article from 1994 [2] a class of criteria for this type of problem is presented. The criteria class is called contrast functions. If the problem is formulated with assistance of a contrast function, it is known that the desired point is a maximum of the contrast function, which means that an iterative method can be formulated. This means that if the algorithm is initiated in a suitable vicinity of the desired solution the algorithm will converge to it.

Separation of dynamic source signal mixtures has been presented parallel to methods for statistical mixtures. One of the first which was presented was Adaptive Noise Cancellation (ANC) [3]. This method assumes that one of the measured signals consists of one and only one source. This assumption is not realistic in many of the problems mentioned previously. In an articel from 1985 [4] a method was presented which uses a backward demixing structure. The method for separation of measured signals is based on a connected version of ANC. In the method the square of the demixing signals s1 and s2 are minimized. Since the minimization takes place via two independent criteria, it can not be said that the method will solve the problem. This method is a subject of a patent application.

The problem with dynamic mixtures is also described in articles [5] and [6], of which the latter is of interest since it can potentially solve the problem via a minimization of the loglikelyhood function. This requires however, that this function can be formulated. The authors of [6] wrote 1993 an article [7] which presents a method for separating dynamically mixed signals via a decorrelation method. This method is a subject of a patent application. In the patent application it is started out from ANC and it is demonstrated how the solution seems when the requirements of ANC are fulfilled. Thereafter, a generalization is formulated of this solution. The generalization is of ad hoc character and cannot therefore be said to be correct. If the method is to separate two dynamically mixed sources with different zero weights, then the algorithm will not solve the problem. This indicates that the generalization is not correct.

Also, ANC is based on minimization of an auto correlation, and in the described generalization the desired solution can be represented by a saddle point rather than by a minimum. In such a case, convergence to the desired solution will not occur. In an article from 1994 [8], a method is described to solve the problem with dynamic channels by using higher order moment. In that article the authors claim that the method can be designed by means of a cost function. This method is a subject of a patent application. However, the method is not based on second order statistics, which results in the need of great computer computational power and more samples.

MOST CHARACTERIZING PARTS OF THE INVENTION

Characteristics of the present invention are that every measured signal is brought to a separation structure comprising cross connected linear filters and subsequent adders, or that every measured signal is brought to a separation structure comprising adders and cross connected linear filters of output signals of said separation structure, and that cross correlation functions between the signals after said adders are calculated for delays k between a first delay K1 and a last delay K2, that a criterion function is used to determine how the linear filters comprised in said separation structure will be designed in every real situation, that said criterion function is formulated as a sum of terms where the addition is extended to all possible cross correlation functions between the output signals of separation structure at all possible delays (k) between K1 and K2, and that each term in said sum has a weight factor and another factor consisting of an even function, f, of a specific cross correlation function at a specific delay.

DESCRIPTION OF A PREFERRED EMBODIMENT

The present invention relates to a new method or separating N source signals from N linear combinations of said signals using a criterion based on second order statistics. It is crucially important to note that the present invention can be based on second order statistics. As is well known to the man skilled in the art, higher order statistics (HOS) requires a large number of samples in order to achieve a good estimate. This results in that algorithms based on HOS converges slowlier and performs poorer than methods which are based on second order statistics.

Supposing that there are N independent and unmeasurable signals which are called source signals. The source signals are input signals to an unknown system, called a channel system. The output signal of the channel system are measurable signals called observable signals. Each observable signal is connected to each source signal via channels (linear filters). All channels associated with a measurable signal is called a channel subsystem. The channel system is consituted by all participating channel subsystem. It should be noted that the observable signals normally is not independent of each other.

Separation of the source signals from the observable signals is formulated in the following way. Given a number of source signals, a number of observable signals and a channel system, the purpose is to separate the source signals from the observable signals, via a demixing system controlled by a criteria.

The algorithm which is the result when minimizing a criterion can be formulated as a first order gradient method (LMS) or a second order gradient method (Newton) or a combination (regularized Newton).

Figure 1:
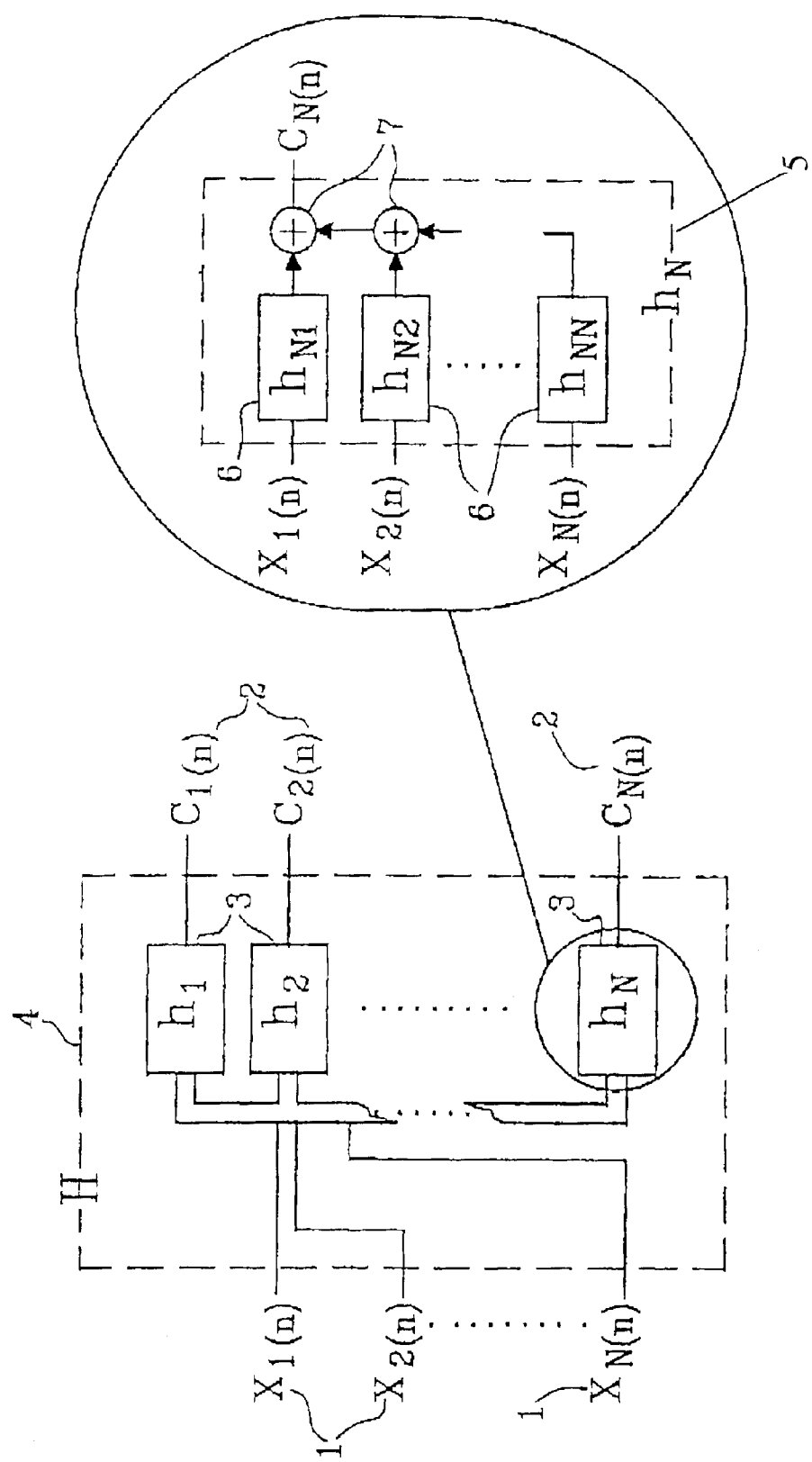
FIGS. 1–5 shows implementations of the present invention
Figure 2:
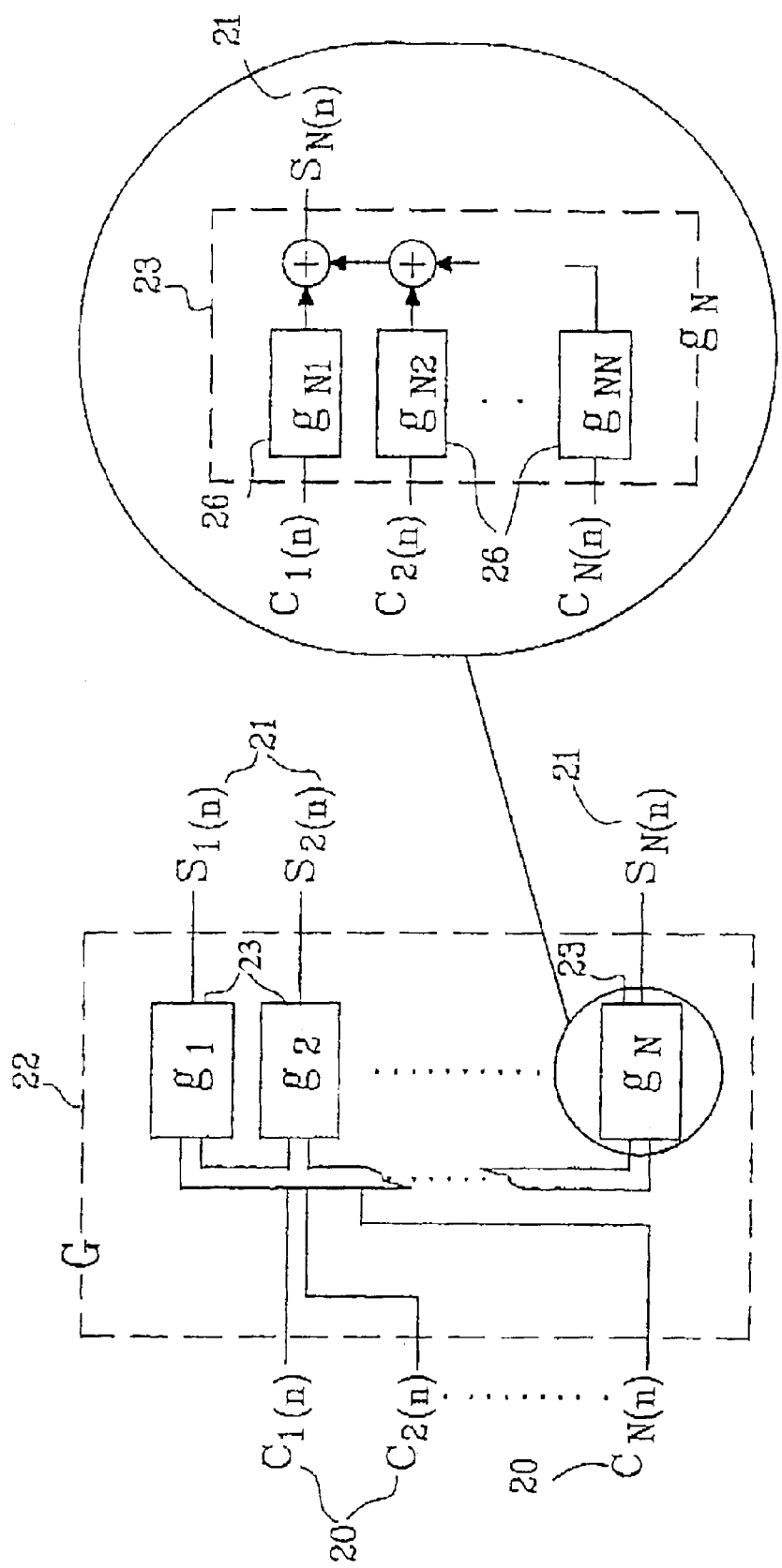

The separation structure needed for this is depicted i FIG. 2. It should be noted that this structure does not give estimates of the source signals but filtered estimates of the source signals. Alternatively, a post filtering is performed. Of the estimates of the structure shown in FIG. 2 in the same spirit as the one in FIG. 4. Principally, the separation structure constitutes a channel system. In order to achieve separation, it is required that the channels are suitably adjusted. The methods described in [7] presents an ad hoc control of the channels which may result in divergence. By relating the control of the channels in the separation structure to a criteria, it is possible to guarantee that the desired solution represents a minimum which implies a radius of convergence to the solution. However, it should be noted that the systems which hereby appear are non-linear, which can result in the existence of multiple convergence points. This problem can be reduced by a priori knowledge or by the fact that the signals after separation present an improved quality.

The criterion or cost function which is planned to be used is minimization of an even function with cross correlation as an argument. The even function is in turn multiplied with a weight function. The cost function is constituted by the sum from lag L1 to lag L2 by the cross correlations. Using mathematics, this is formulated as:

$$V(\theta) = \sum_{l=L_1}^{L_2} \sum_{i=1}^{N} \sum_{j>i}^{N} w(l) f(R_{s_i s_j}(\theta, l)) \quad (1)$$

where w(l) is a strictly positive real function (the weight function), $f(x) \geq 0 \; \forall x$ is an even function and $\theta$ is a vector with channel weights. It is noted that since the sequences are assumed to be real, also each cross correlation $R_{sisj}(\theta,l)$ is also real and thus $V(\theta)$ is real.

The minimum of (1) is therefore $V(\theta_D)=0_1$, where $\theta_0$ is the vector with true channel weights.

By obtaining the derivative of $\theta$ of this criterion, the gradient is obtained. An iterativ solution to (1) can then be formulated as $$\hat{\theta}(n+1) = \hat{\theta}(n) - \mu(n) \frac{\partial V(\theta)}{\partial \theta}\bigg|_{\theta=\hat{\theta}(n)} \quad (2)$$

where $\mu(n)$ is an adaptational amplification. If the error surface represented by $V(\theta)$ is flat, the iterative solution (2) results in a slow convergence. This can improved by multiplying the gradient to the criterion with the inverse of its Hessian matrix, i.e.

$$\hat{\theta}(n+1) = \hat{\theta}(n) - \mu(n) H^{-1}(\hat{\theta}(n)) \frac{\partial V(\theta)}{\partial \theta}\bigg|_{\theta=\hat{\theta}(n)} \quad (3)$$

The mulitplication implies an increased updating speed in $\theta$. A problem is however that the Hessian must be positively definite or else the direction of movement can be influenced in an undesired way. In order to solve this problem a modified Hessian can be used. This one is guaranteed to be positively semidefimite and is defined as $$\overline{H}^{-1} = \left( \left( \frac{\partial V(\theta)}{\partial \theta} \right) \left( \frac{\partial V(\theta)}{\partial \theta} \right)^T \right)^{-1} \quad (4)$$

where T implies the transposed matrix.

In the deduction of this algorithm, it is assumed that the source signals are stationary and stochastical processes. A speech signal is not a stationary process but can be modulated as one in blocks, i.e. we can assume that the correlation function is time varying. Also, it is possible without greater complications to describe the algorithm in terms of a more general form of correlations, i.e. not stationary. Generally the correlation function can be written as R(i,l) where i and j are lag to the correlation. If the process is stationary the correlation only depends on the difference of these lags. The correlation between two stochastical processes y and z can be defined as:

$$R_{zy}(i,l) = E\{z(n+i)y(n+l)\}$$

If the processes y and z are stationary the above correlation can be written as:

$$R_{zy}(i,l) = E\{z(n+i)y(n+l)\} = R_{zy}(i-l)$$

Figure 3:
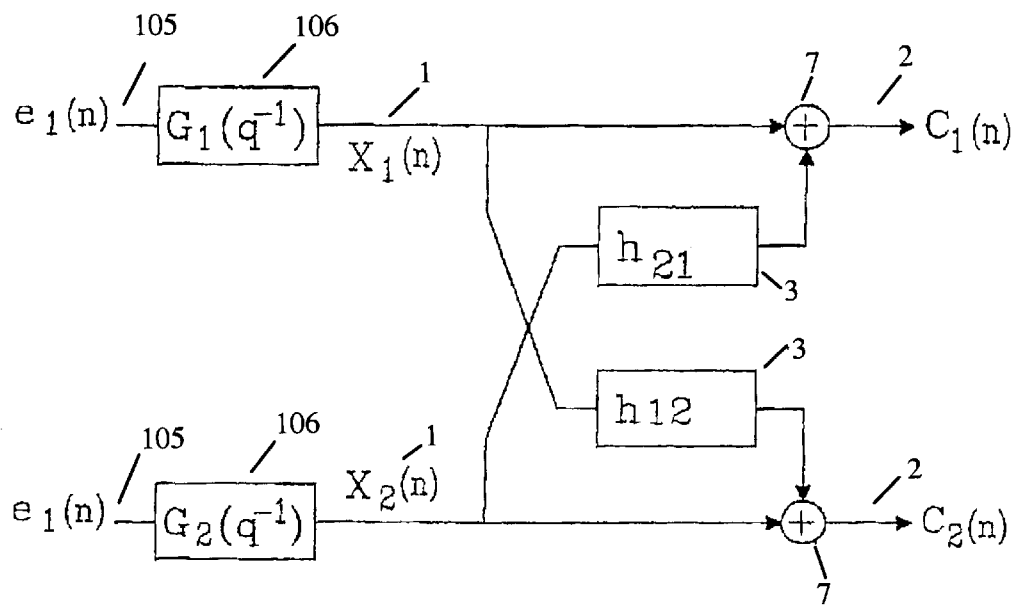

Further, two source signals and two measuring equations will be assumed. In FIG. 3 the scenario of the channel system is shown. We here contemplate the source signal x1(n) as the primary signal, i.e. the signal which is assumed to be of interest for the user of the invention. The primary signal can be speech, data, etc. The secondary signal is hereby denoted x2(n). This signal constitutes what the user desires to eliminate. The secondary signal can be constituted by a background disturbance which in turn may be constituted by several sources. The invention can thereby separate primary and secondary signals from the two observable equations e1(n) and e2(n) under the condition that the primary signal and the secondary signal are independent (uncorrelated is sufficient). We hereby use equation (1) with the choice $f(x)=x^2$ and establish that the criteria to be minimized are given by $$V(\theta) = \sum_{l=L_1}^{L_2} w(l)(R_{s_1 s_2}(\theta, l))^2 \quad (5)$$

It should be noted that the weight function is not dependent on the parameters and can therefore be seen as constants in the context of obtaining the derivative. This gives us an opportunity, without loss of generality, to set the weight function to 1 for all choices of 1.

Figure 4:
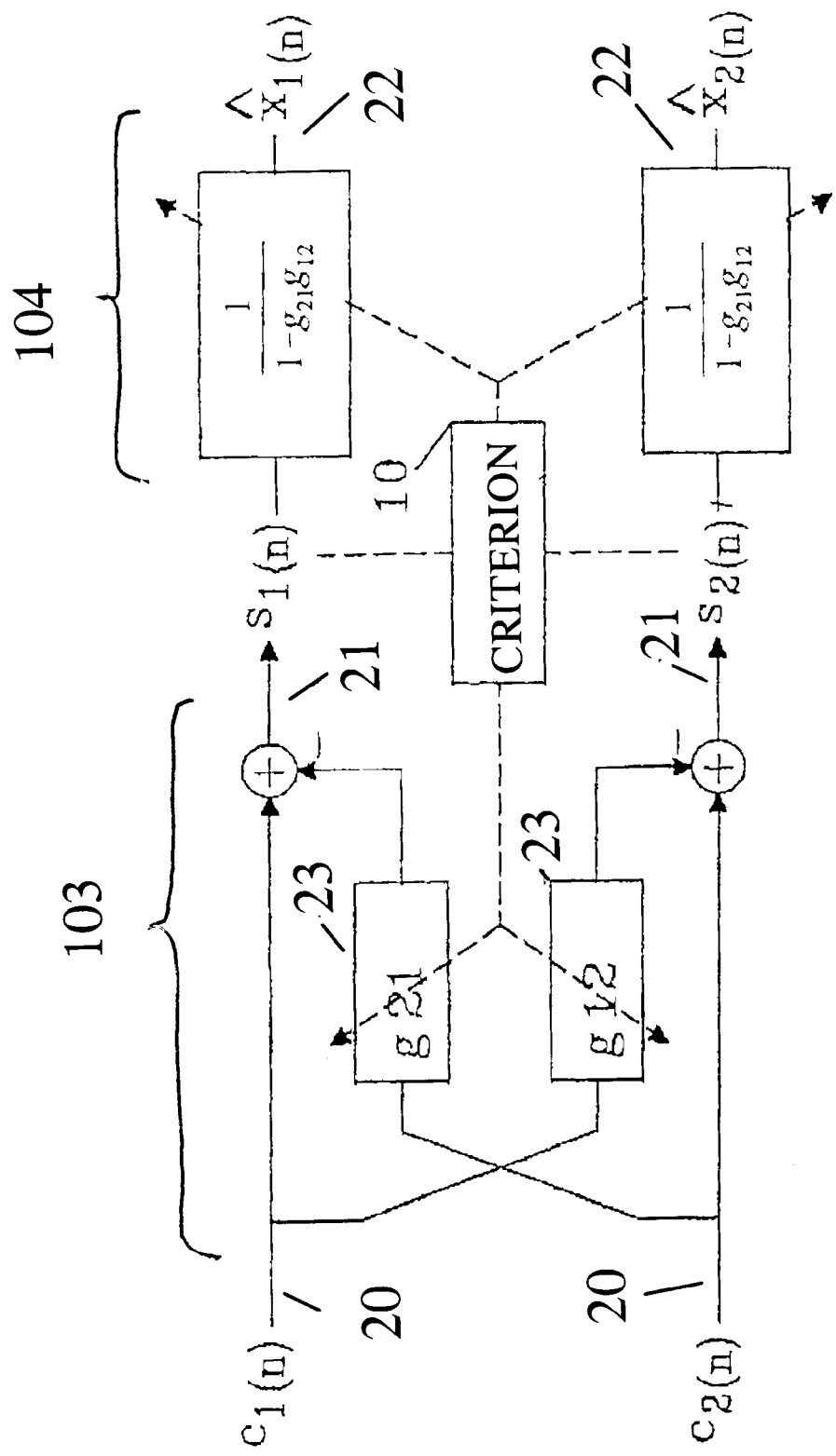

Principally, the cross correlation function would be able to be estimated by means of the outputs of the separation structure in FIG. 4. A better method is, however, to determine an explicit expression for the cross correlation given stationarity and a decided number of parameters. This is better since an estimate of the cross correlation is influenced by the parameters in the separation structure and an uncertainty arises in the estimate. Assuming temporary stationarity in e1(n) and e2(n), this implies that estimates of correlations with regard to these stable estimates and the effect of parameter alterations are only observable when calculating the cross correlation by using the explicit expression. Under ideal circumstances estimating the cross correlation and its calculation would not differ. Practically, estimating implies an undesrired uncertainty in the estimates, however. In applications with high data rates, it can be rewarding to estimate the cross correlation. Differently put, it is an decision to take which depends on the application.

The cross correlation is given by $$R_{s_1 s_2}(\theta,l) = R_{e_1 e_2}(l) - c^T r_{e_2 e_2}(l) - d^T r_{e_1 e_1}(l) + c^T R_{e_2 e_1}(l) d \quad (6)$$

where $$\theta = [c^T d^T]^T$$

the vectors and matrix in the equation follows from the definition of the cross correlation and FIG. 4. Formulation of an LMS-like method and a Newton method follows from equation (5) and equation (6).

Figure 5:
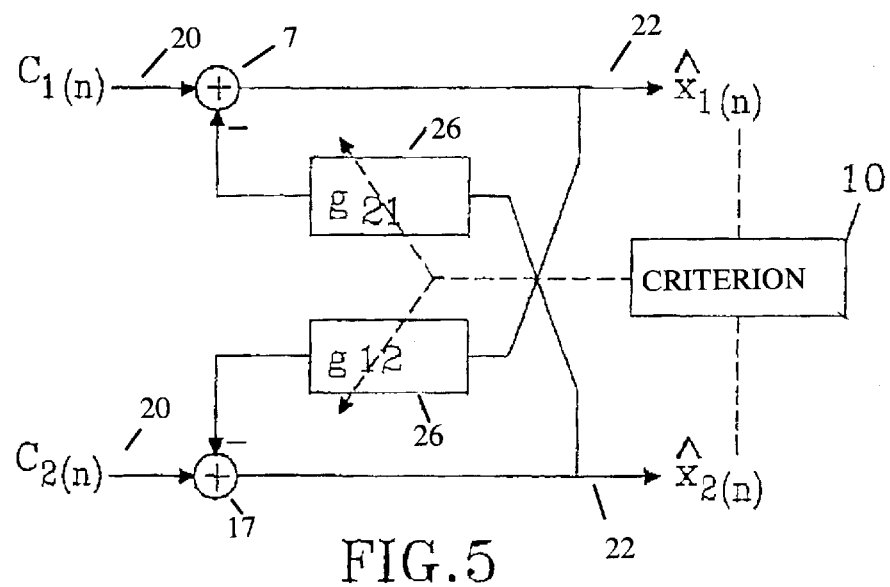

Depending on the forward (FIGS. 4) or the backward-connected (FIG. 5) separation structure being used, different expressions for updating the coefficients in e are obtained. It should be noted that the backward connected structure results in immediate estimates of the source signals. The forward connected example requires an inverse filtering of the output signals to obtain a similar result. The advantage with the forward connected separation structure is that it is stable if the involved filters are of FIR type.

By using a regularized Newton algorithm the method can be used without the use of signal detectors. The task of a detector would be to detect whether the useful signal exists. In e.g. ANC this is necessary if the reference signal contains the primary signal.

The method comprises the following steps:
1. Deciding the correlations e1(n) and e2(n).
2. Calculating cross correlation values $R_{s1s2}(l)$ ∀l: L1≦l≦L2 determine the cost
3. Updating channel weights with one of the three types of algorithms (LMS, Newton or Reg. N)
4. Updating correlations of e1(n) and e2(n).
5. Go to 2.

Suitable choices of L1 and L2 are L2>70 and L1=−L2. A suitable choice of f(*) is $f(x)x^2$. The task of the weight function is to put the most weight at the minimization of the cross correlation lag with good accuracy, i.e. −30≦l≦30.

Preferably, the method is to be implemented with a Digital Signal Processor or a fast Micro Processor, alternatively, a custom design circuit can be used.

It should be noted that the present inventions can be implementd in several ways with within the scope of the appended claims.

It should be noted that the number of measurable signals can he limited to two.

REFERENCES

[1] C. Jutten and J. Herault "Blind separation of sources, part I. An adaptive algorithm based on neuromimetic architecture", Signal Processing, vol. 24, no. 1, pp. 1–10, 1991.

[2] P. Comon, "Independent component analysis, a new concept?", Signal Processing, vol. 36, no. Jun, pp. 287–314, 1994.

[3] B. Widrow, J. R. Glover, J. M. McCool, J. Kiaunitz, C. C. Williams, R. H. Hearn, J. R. Zeidler, E. Dong and R. C. Goodlin, "Adaptive noise cancellingg: Principles and applications", Proc. IEEE, vol.63, no. 12, pp. 1692–1716, 1975.

[4] G. Mirchandani, R. L. Zinser and J. B. Evans, "A new adaptive noise cancellation scheme in the presence of crosstalk", IEEE Trans., Circ., Syst.-II, vol. 39, no. 10, pp. 681.694, 1992.

[5] M. Al-Kindi and J. Dunlop, "Improved adaptive noise cancellation in the presence of signal leakage on the noise reference channel". Signal Processing., vol. 17, no. Jul, pp. 241–250, 1989.
[6] M. Feder, A. V. Oppenheim and E. Weinstein, "Maximum likelihood noise cancellation using the EM algorithm", IEEE Trans. Acoust. Speech, Signal Processing, vol. 37, no. 2, pp. 204–216, 1989.
[7] E. Weinstein, M. Feder and A. V. Oppenheim, "Multichannel signal separation by decorrelationl", IEEE Trans. Speech Audio Processing, vol I, no. 4, pp. 405–413, 1993.
[8] D. Yellin and E. Weinstein, "Criteria for multichannel signal separation", IEEE Trans. Signal Processing, vol. 42, no. Aug, pp. 2158–2168, 1994.

What is claimed is:

1. A method for separating a mixture of source signals to regain said source signals, said method being based on measured signals, comprising the steps of:
bringing every measured signal to a separation structure comprising adders and cross-connected linear filters of output signals of said separation structure,
calculating cross-correlation functions between the signals after said adders for lags between a first lag and a last lag, and
using a criterion function to determine how the linear filters comprised in said separation structure will be designed,
wherein said criterion function is formulated as a sum of terms where the addition is extended to at least one cross-correlation function between output signals of the separation structure for a delay between said first lag and last lag, and wherein each term in said sum has a weight factor and a factor consisting of an even function of a specific cross-correlation function at a specific delay.

2. The method according to claim 1, wherein the number of measurable signals is two.

3. The method according to claim 1, wherein said even function is a quadrature function.

4. The method according to claim 1, wherein said filters of said separation structure are controlled by a criterion being one of LMS, Newton or regularized Newton.

5. The method according to claim 1, wherein said filters of said separation structure are of finite impulse response (FIR) type.

6. A method for separating a mixture of source signals to regain said source signals, said method being based on measured signals, and comprising the steps of:
bringing every measured signal to a separation structure comprising adders and cross-connected linear filters of output signals of said separation structure,
calculating cross-correlation functions between the signals after said adders for lags between a first lag and a last lag, and
using a criterion function to determine how said linear filters will be designed,
wherein said criterion function is formulated as a sum of terms where the addition is extended to all possible cross-correlation functions between the output signals of the separation structure for a delay between said first lag and last lag, and each term in said sum having a weight factor and a factor consisting of an even function of a specific cross-correlation function at a specific delay.

7. The method according to claim 6, wherein the number of measurable signals is two.

8. The method according to claim 6, wherein said even function is a quadrature function.

9. The method according to claim 6, wherein said filters of said separation structure are controlled by a criterion being one of LMS, Newton or regularized Newton.

10. The method according to claim 6, wherein said filters of said separation structure are of finite impulse response (FIR) type.

11. A method for separating a mixture of source signals to regain said source signals, said method being based on measured signals, comprising the steps of:
bringing every measured signal to a separation structure comprising cross-connected linear filters of the measured signals and subsequent adders,
calculating cross-correlation functions between the signals after said adders for lags between a first lag and a last lag, and
using a criterion function to determine how the linear filters comprised in said separation structure will be designed,
wherein said criterion function is formulated as a sum of terms where the addition is extended to at least one cross-correlation function between output signals of the separation structure for a delay between said first lag and last lag, and wherein each term in said sum has a weight factor and a factor consisting of an even function of a specific cross-correlation function at a specific delay.

12. The method according to claim 11, wherein the number of measurable signals is two.

13. The method according to claim 11, wherein said even function is a quadrature function.

14. The method according to claim 11, wherein said filters of said separation structure are controlled by a criterion being one of LMS, Newton or regularized Newton.

15. The method according to claim 11, wherein said filters of said separation structure are of finite impulse response (FIR) type.

16. A method for separating a mixture of source signals to regain said source signals, said method being based on measured signals, and comprising the steps of:
bringing every measured signal to a separation structure comprising cross-connected linear filters of the measured signals and subsequent adders,
calculating cross-correlation functions between the signals after said adders for lags between a first lag and a last lag, and
using a criterion function to determine how said linear filters will be designed,
wherein said criterion function is formulated as a sum of terms where the addition is extended to all possible cross-correlation functions between the output signals of the separation structure for a delay between said first lag and last lag, and each term in said sum having a weight factor and a factor consisting of an even function of a specific cross-correlation function at a specific delay.

17. The method according to claim 16, wherein the number of measurable signals is two.

18. The method according to claim 16, wherein said even function is a quadrature function.

19. The method according to claim 16, wherein said filters of said separation structure are controlled by a criterion being one of LMS, Newton or regularized Newton.

20. The method according to claim 16, wherein said filters of said separation structure are of finite impulse response (FIR) type.

* * * * *